United States Patent [19]

Taylor et al.

[11] 4,153,883
[45] May 8, 1979

[54] ELECTRICALLY ALTERABLE AMPLIFIER CONFIGURATIONS

[75] Inventors: David L. Taylor; Stephen A. Harris, both of Melbourne, Fla.

[73] Assignee: Harris Corporation, Melbourne, Fla.

[21] Appl. No.: 861,331

[22] Filed: Dec. 16, 1977

[51] Int. Cl.² .................. H03F 3/26; B01J 17/00
[52] U.S. Cl. .................. 330/262; 29/577 R; 330/273; 330/275
[58] Field of Search ............ 29/584, 585, 586, 577; 330/262, 273, 275

[56] References Cited

U.S. PATENT DOCUMENTS

| | | | |
|---|---|---|---|
| 3,641,516 | 2/1972 | Castrucci et al. | 29/584 UX |
| 3,761,787 | 9/1973 | Davis et al. | 330/307 X |
| 3,930,304 | 1/1976 | Keller et al. | 29/586 X |

Primary Examiner—Lawrence J. Dahl
Attorney, Agent, or Firm—Leitner, Palan, Martin & Bernstein

[57] ABSTRACT

An amplifier for use as on the output buffer for semiconductor memories including a fusible element added to a push-pull configuration to allow permanent conversion to an open collector configuration by blowing the fusible element or including a semiconductor element added to a push-pull configuration to cause it to have an open collector configuration and being permanently converted to a push-pull configuration by shorting the semiconductor element.

32 Claims, 7 Drawing Figures

ELECTRICALLY ALTERABLE AMPLIFIER CONFIGURATIONS

BACKGROUND OF THE INVENTION

The present invention is directed generally to amplifiers, and more specifically to an output buffer which is electrically alterable to be permanently converted between push-pull configuration and open-collector configuration or vice-versa.

The prior art has included convertible amplifiers which generally have mechanical switches such as manually operated switches or relays or transistor switches to select a desired configuration. These circuits have not been used in integrated circuits.

Integrated circuits having transistor-to-transistor logic (T.T.L.) output buffers are commonly configured as open-collector or push-pull. The standard approach taken by semiconductor manufacturers is to include within the circuitry of the buffers the components necessary to provide the push-pull configuration and by means of a metal option create the open-collector configuration. Two metal masks are required to provide the simple option. Also, two sets of test programs are required at the final test area for all D.C. tests. All tests must separate open-collector from push-pull configurations due to inevitable product mix at both the wafer, assembly and final test rescreen levels. This leads to serious logistics problems of maintaining product identity in the wafer fabrication process as well as in the final test areas. Thus there exists a need for a methodology of configuring amplifiers or output buffers in a single configuration which may be electrically altered after final testing to allow selection of a desired permanent configuration.

SUMMARY OF THE INVENTION

The present invention eliminates the problem of the prior art by providing a single configuration incorporating electrically alterable elements for selecting the output buffer configuration after testing. The output buffer is generally configured as a push-pull amplifier having the first transistor in an emitter follower configuration and the second transistor in a common emitter configuration. Fusible elements may be provided in the collector or emitter circuits of the first transistor. The first transistor may be a single transistor or a Darlington amplifier configuration. Additionally, this fusible element may be placed in the base circuit of the output transistor of the Darlington configuration in lieu of the collector or emitter. Electrical altering of the fusible element is achieved by grounding the output and raising the collector voltage sufficiently to blow the fusible element and convert the amplifier from a push-pull amplifier to an open collector configuration. Additional circuit elements such as diodes and zener diodes are provided to aid the electrical altering of the fusible elements.

In lieu of a fusible element, the push-pull configuration may include a semiconductor element connected so as to cause the amplifier to assume an open collector configuration. The semiconductor element is shorter by electrical altering means such as grounding the output and raising the collector voltage sufficient to short the semiconductor element and thereby convert the configuration from an open-collector to a push-pull configuration. The semiconductor element may be in the emitter circuit of the first transistor or may be in the base circuit of the output of a Darlington amplifier substituted for the first transistor. Additional zener diodes are provided to effectuate the electrical alteration and to protect the circuit. The electrically alterable amplifier is used generally as output buffers for semiconductor memories.

The fusible element may be a metallic link or a fusible material as a layer in an integrated circuit. The semiconductor element may be a P-N junction or a high resistance device electrically alterable to a low resistance state.

OBJECTS OF THE INVENTION

An object of the present invention is to provide an output amplifier having an electrically alterable element to permanently alter the configuration of the amplifier.

Another object is to reduce the product mix at the test stages by providing a singly configured amplifier which is electrically alterable to change configurations.

A further object of the invention is to reduce inventory requirements by providing an amplifier whose configuration may be determined permanently by the customer.

Still another object is to reduce photo mask inventory by providing a single amplifier electrically alterable to change configurations.

A still further object of the invention is to provide an amplifier whose configuration may be changed which is compatible with integrated circuit technology.

Other objects, advantages, and novel features of the present invention will become apparent from the following detailed description of the present invention when considered in conjunction with the accompanying drawings.

DESCRIPTION OF THE PREFERRED EMBODIMENTS

Figure 1:
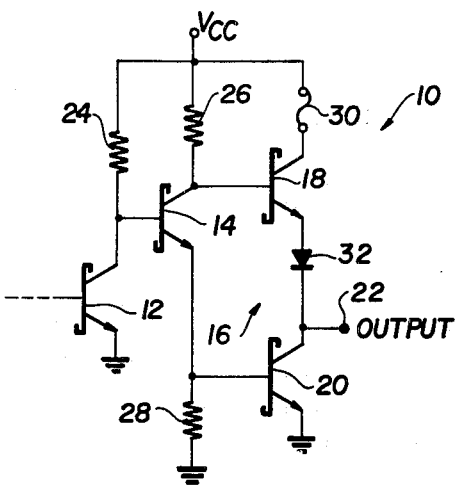
FIG. 1 is a schematic diagram of an amplifier incorporating the principles of the present invention and having a fusible element in the collector circuit.

FIG. 1, which illustrates the preferred embodiment of an amplifier having an electrically alterable element therein, includes an input or preamplifier transistor 12, a phase splitting transistor 14, and a push-pull output amplifier stage 16. Transistor 18 being in an emitter follower configuration and transistor 20 being in a common emitter configuration comprise the push-pull amplifier 16. The output of the push-pull stage 16 and the total buffer amplifier 10 is output terminal 22. Biasing resistors 24, 26, and 28 and diode 32 are provided. Connected in the collector circuit of transistor 18 of the push-pull stage is a fusible element 30. Buffer amplifier 10 as depicted is in a push-pull configuration. Transistors 12, 14, 18 and 20 are illustrated as Schottky bipolar transistors.

In order to convert the push-pull configuration of output amplification stage, 16, a signal is applied to the base of transistor 12 to turn it on, the output 22 is grounded and the collector voltage ($V_{CC}$) is raised sufficiently to cause a voltage to appear across fusible element 30 so as to destroy or blow the fusible element 30. With the fusible element 30 having a resistance of approximately 150 ohms, raising the collector voltage $V_{CC}$ to approximately 12 volts will cause approximately 10 volts to appear across the fuse, and destroy, open, or blow the fusible element 30. By forming an open circuit in the collector circuit of transistor 18, the buffer 10 and more specifically output stage 16, is converted to an open collector configuration.

Figure 2:
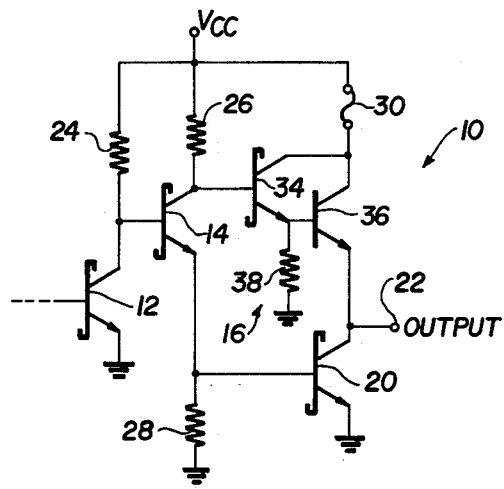
FIG. 2 is a schematic diagram of an amplifier similar to that of FIG. 1 including a Darlington amplifier stage.

FIG. 2 illustrates a modification of buffer 10 wherein the emitter follower transistor 18 of the push-pull stage 16 has been replaced by a Darlington amplifier stage. Transistor 34 and 36 and biasing resister 38 form the Darlington amplifier. The diode 32 has been eliminated. The operation and electrical alteration of buffer 10 with the Darlington amplifier stage as illustrated in FIG. 2 is identical to that of the buffer illustrated in FIG. 1. It should be noted that transistor 34 is a Schottky bipolar transistor and transistor 36 is a bipolar transistor. The buffer 10 of FIGS. 1 and 2 having the fusible element 30 in the collector circuit only produce, upon destruction of the fusible element, a substantially open collector configuration by reducing the AC or DC currents considerably.

Figure 3:
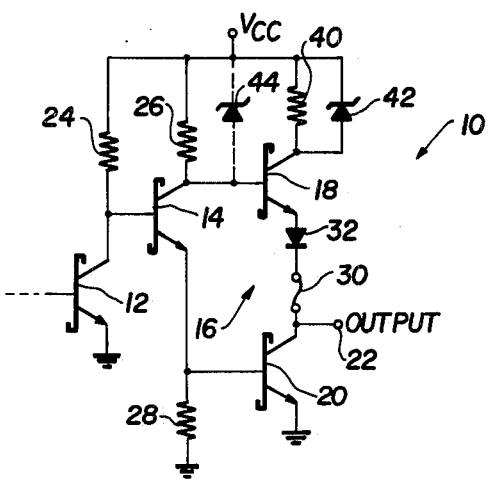
FIG. 3 is a schematic diagram of an amplifier incorporating the principles of the present invention and having a fusible element in the emitter circuit.

Another buffer 10 is illustrated in FIG. 3 wherein the fusible element 30 is in the emitter circuit of the emitter follower transistor 18 of the push-pull stage 16. A biasing resistor 40 is added to the collector circuit of transistor 18 and a zener diode 42 is connected across the biasing resistor 40. If desired, an additional zener diode 44 may be connected between the base of transistor 18 and the collector bias voltage $V_{CC}$, as illustrated in phantom. The Electrical alteration of the buffer 10 of FIG. 3 requires only the grounding of output 22 and raising the collector voltage $V_{CC}$. The buffer 10 of FIG. 3 is normally in a push-pull configuration and upon destruction or opening of fusible element 30, the buffer 10 and more specifically at the output stage 16 is converted to a true collector configuration.

Figure 4:
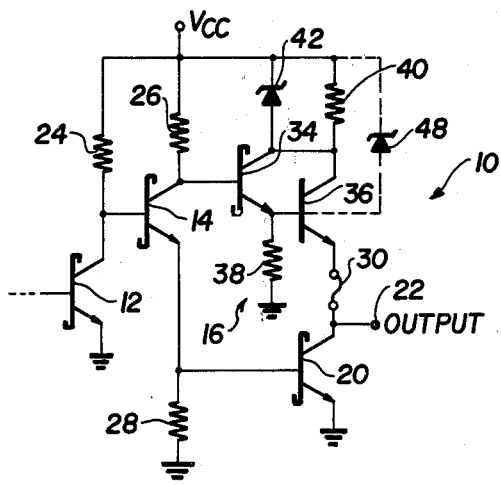
FIG. 4 is a schematic diagram of an amplifier similar to that of FIG. 3 including a Darlington amplifier stage.

Buffer 10 as illustrated in FIG. 4 is similar to that of FIG. 3 except that the emitter follower transistor 18 is replaced by Darlington amplifier including transistors 34, 36 and biasing resistor 38. Diode 32 has been eliminated and if desired an additional zener diode 48, as illustrated in phantom, may be included between the collector voltage supplied $V_{CC}$ and the base of output transistor 36 of the Darlington pair. The buffer circuit 10 of FIG. 4 operates and is electrically altered identically to buffer 10 of FIG. 3. Although the buffers of FIGS. 3 and 4 provide a true open circuit configuration upon destruction of the fusible element 30, whereas the buffers of FIGS. 1 and 2 provide a substantially open circuit configuration, the buffers of FIGS. 3 and 4 have the disadvantage of producing a slight deterioration of the $V_{OH}$. For an $I_{OH}$ of −2 milliamperes, the degradation is small or approximately 100 millivolts. For high $I_{OH}$ specifications, degradation may not be satisfactory under extreme temperatures and voltages. The circuits of FIGS. 3 and 4 with the fusible element 30 in the emitter circuit is designed specifically for low value fuses. To program fusible element 30, for example 50 ohms, the collector voltage $V_{CC}$ is raised to approximately 12 volts while the output 22 is grounded.

Figure 5:
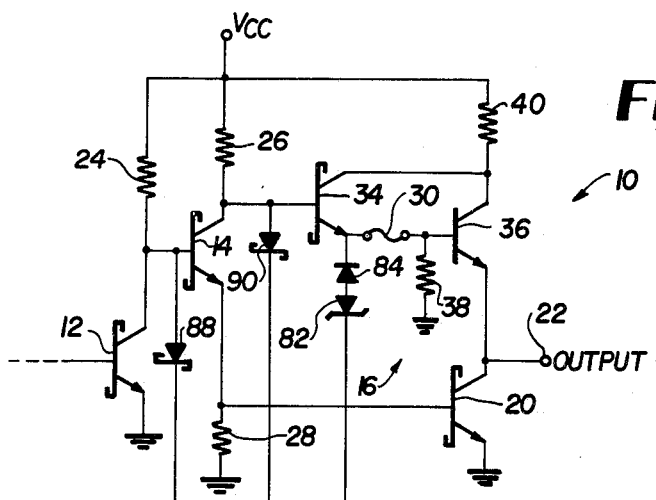
FIG. 5 is a schematic diagram of an amplifier incorporating the principles of the present invention and having a fusible element in a Darlington amplifier stage.

Still another circuit for buffer amplifier 10 is illustrated in FIG. 5 including a Darlington amplifier having transistors 34, 36 and biasing resistor 38. Fusible element 30 is connected between the emitter of transistor 34 and the base of transistor 36 of the Darlington amplifier. To program or to destroy or open the fusible element 30, an electrical alteration circuit 50 is included. The input 52 of the electrical alteration circuit 50 receives the chip enable signal $\overline{CE}$ and transmits it to the base of transistor 54. The base of transistor 56 is connected to transistor 54 through diode 58 and Schottky diode 60. The output of phase splitting transistor 56 is fed to a Darlington pair of transistors 62, 64 and the other member of a push-pull configuration or output transistor 68. Biasing resistors 70, 72, 74, and 76 are provided in the electrical alteration circuit 50. Diode 78 connects the input 52 to ground.

The input terminal 52 is also connected through line 80, zener diode 82, and diode 84 to the emitter of transistor 34 and the fusible element 30. The output of the push-pull stage of the electrical alteration circuit is connected by a line 86 and Schottky diode 88 to the base of the phase splitting transistor 14 of buffer 10, and through Schottky diode 90 to the base of the transistor 34 of buffer 10.

As with FIGS. 1–4, the buffer 10 of FIG. 5 is in a push-pull configuration. To electrically alter the fusible element 30 to convert the configuration from a push-pull to an open-collector configuration, the signal input 52 of the electrical alteration circuit 50 is raised to approximately 15 volts and the output 22 of the buffer 10 is grounded. This condition applies approximately 6.5 volts across a fusible element 30, of approximately 150 ohms, and causes it to blow or form an open circuit. When the fusible element 30 is blown, the output buffer is converted from a push-pull to an open collector configuration.

The buffers and amplifiers of FIGS. 1–5 are configured in a push-pull configuration and include fusible elements which may be programmed to convert permanently the buffer amplifier to an open collector configuration. Another circuit which embodies the principle of the present invention is illustrated in FIGS. 6 and 7, wherein an electrically alterable element is included in a buffer amplifier having an open collector configuration and, by electrically alterable element, the configuration is permanently converted to a push-pull configuration.

Figure 6:
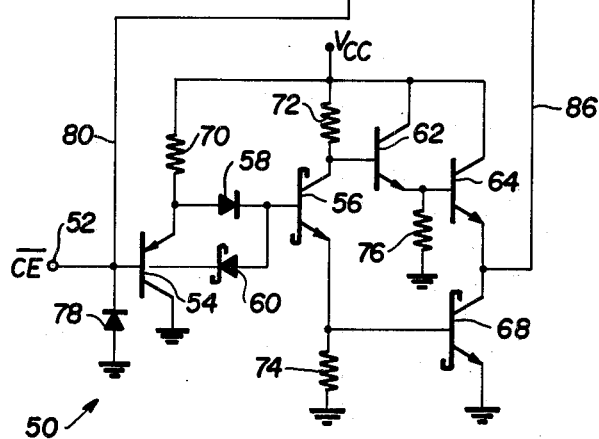
FIG. 6 is a schematic diagram of an amplifier incorporating the principles of the present invention and having a diode in the emitter circuit as the electrically alterable element.

As illustrated in FIG. 6, the input or preamplifier stage includes a transistor 92 connected in a common base configuration having a biasing resistor 94. The phase splitting transistor 14 is connected thereto and the output stage is connected in a generally push-pull configuration having a Darlington amplifier stage 34, 36 connected in an emitter follower configuration and a common emitter configured transistor 20. The output of the buffer is at 22. Other biasing resistors 26, 28, 38, and 40 are provided. The electrically alterable element of FIG. 6 is a PN junction device or diode 96 having its anode connected to the output 22 and its cathode connected to the emitter of transistor 36. This connection of diode 96 prevents normal conduction through the Darlington amplifier so that the buffer of FIG. 6 has a generally open collector configuration. Electrically alterable element or diode 96 is programmed by grounding the output 22 and raising the collector voltage V_{CC} to approximately 16 volts. This will apply a high current through diode 96 to thereby alter its characteristics and create a short across the diode. The shorting of diode 96 permanently converts the buffer amplifier from an open collector configuration to a push-pull configuration. A zener diode 42 is connected across biasing resistor 40 and aids in the electrical alteration of the electrically alterable element 96.

Figure 7:
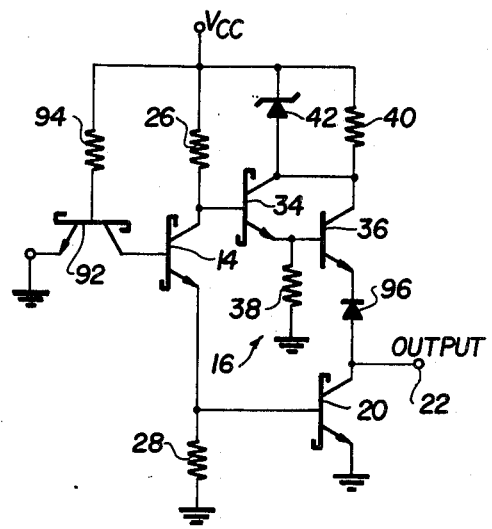
FIG. 7 is a schematic diagram of an amplifier incorporating the principles of the present invention and having a diode in a Darlington amplifier stage.
Figure 7:
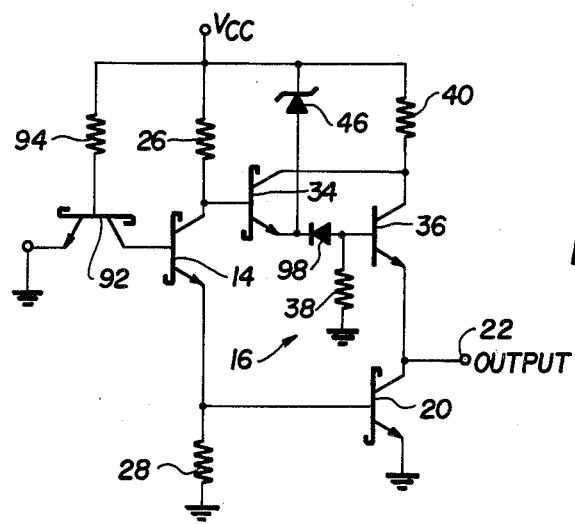

Another circuit for a buffer amplifier having initially an open collector configuration permanently converted by electrical alteration to a push-pull configuraiton is illustrated in FIG. 7. The circuit of FIG. 7 is similar to FIG. 6 except that the electrically alterable PN junction or diode is illustrated as 98 and interconnects the emitter of transistor 34 to the base of transistor 36 of the Darlington amplifier. Also, the zener diode 42 is replaced by the zener diode 46 which aids in the electrical alteration of the diode 98. The operation and electrical alteration function of the buffer amplifier in FIG. 7 is similar or identical to the operation of the buffer amplifier of FIG. 6. The only limitation of using electrically alterable PN junction devices to convert the configuration of the output amplifier is that the transistor geometries must be adjusted to insure that the devices through which the high current must flow to short the diode are not damaged.

The electrically alterable PN junctions 96 and 98 in FIGS. 6 and 7 are illustrated as diodes. A preferred configuration for these diodes is to short the collector and base of a transistor. The diode thus formed would be the emitter-base junction or diode. The diodes 96 and 98 in FIGS. 6 and 7 respectively may be replaced by other semiconductor devices which are electrically alterable.

It should be noted that both techniques of using a fusible element, like 30, or a virtually open circuit semiconductor device which may be shorted, like 96 and 98, are compatible with standard bipolar transistor technology. Transistors and zener diode breakdown voltages required are inherent in the process technology. The use of electrically alterable devices to permanently alter the configuration of an output amplifier can be used in electrically alterable product types, for example, PROMS or ROMS. The electrically alterable buffers serve primarily as an output buffer for a semiconductor memory and bipolar integrated array.

The use of fuses and P-N junctions are but examples of the type of electrically alterable elements which may be used and other electrically alterable elements from the PROM technology may be used.

From the preceding description of the preferred embodiments, it is evident that the objects of the invention are obtained and though the invention has been described and illustrated in detail, it is to be clearly understood that the same is by way of illustration and example only and is not to be taken by way of limitation. Although only bipolar transistor configurations are illustrated, the present invention may also be applied to MOS amplifiers to convert amplifier configurations. The spirit and scope of the invention is to be limited only by the terms of the appended claims.

We claim:

1. In a push-pull amplifier having phase splitting means, a first transistor means in an emitter follower configuration and a second transistor means in a common emitter configuration, the improvement comprising:

electrically alterable means in said first transistor means for permanently converting said amplifier from a push-pull to an open-collector configuration.

2. The amplifier according to claim 1 wherein said electrically alterable means includes a fusible means in the collector circuit of said first transistor means for converting said amplifier from a push-pull to a substantially open collector configuration.

3. The amplifier according to claim 2 including a diode in the emitter circuit of said first transistor means.

4. The amplifier according to claim 2 wherein said first transistor means includes a Darlington amplifier.

5. The amplifier according to claim 1 wherein said electrically alterable means includes a fusible means in the emitter circuit of said first transistor means for converting said amplifier from a push-pull to an open collector configuration.

6. The amplifier according to claim 5 including a diode in the emitter circuit and a zener diode in the collector circuit of said first transistor means.

7. The amplifier according to claim 5 wherein said first transistor means including a Darlington amplifier and a zener diode in the collector circuit.

8. The amplifier according to claim 1 wherein said electrically alterable means includes a PN junction means connected to said first transistor means for causing said amplifier to have an open-collector configuration, shorting said PN junction means by electrical alteration converts said amplifier from an open-collector to a push-pull configuration.

9. The amplifier according to claim 8 wherein said PN junction means includes a diode in the emitter circuit of said first transistor means.

10. The amplifier according to claim 9 wherein said first transistor means includes a Darlington amplifier and a zener diode in the collector circuit of said Darlington amplifier for programming said diode.

11. The amplifier according to claim 8 wherein said first transistor means include a Darlington amplifier and said PN junction includes a diode in the base circuit of the output transistors of said Darlington amplifier.

12. The amplifier according to claim 11 including a zener diode connected to said base circuit for use during electrical alteration of said diode.

13. The amplifier according to claim 1 wherein said first amplifier means includes a Darlington amplifier and said electrically alterable means includes a fusible means in the base circuit of the output transistor of said Darlington amplifier.

14. The amplifier according to claim 13 including a diode connected to said base circuit for use during electrical alteration of said fusible means.

15. The amplifier according to claim 1 wherein said electrically alterable means includes a fusible element for converting said amplifier from a push-pull configuration to an open-collector configuration upon being electrically altered.

16. The amplifier according to claim 1 wherein said electrically alterable means includes a PN junction for converting said amplifier from an open-collector configuration to a push-pull configuration upon being electrically altered.

17. In a semiconductor memory having an output buffer which includes a preamplifier, a phase splitter and an output amplifier, the improvement being said output amplifier which comprises:

first transistor means in an emitter follower configuration;

second transistor means in a common emitter configuration; and electrically alterable means in said first transistor means for permanently converting said output amplifier from a push-pull to an open-collector configuration.

18. The semiconductor memory according to claim 17 wherein said electrically alterable means includes a fusible element in the collector circuit of said first transistor means such that applying a signal to the preamplifier, increasing the collector voltage and grounding the output of said buffer blows said fuse element to convert said output amplifier from a push-pull configuration to a substantially open collector configuration.

19. The semiconductor memory according to claim 17 wherein said electrically alterable means includes a fusible element in the emitter circuit of said first transistor means such that increasing the collector voltages and grounding the output of said output amplifier blows said fusible element to convert said output amplifier from a push-pull configuration to an open collector configuration.

20. The semiconductor memory according to claim 17 wherein said first transistor means includes a Darlington amplifier and wherein said electrically alterable means includes a fusible element in the base circuit of the output transistor of said Darlington amplifier and a electrical alteration circuit connected to said output buffer for blowing said fusible element to convert said output amplifier from a push-pull configuration to an open-collector configuration.

21. The semiconductor memory according to claim 17 wherein said electrically alterable means includes a fusible element for converting said amplifier from a push-pull configuration to an open-collector configuration upon being electrically altered.

22. The semiconductor memory according to claim 17 wherein said electrically alterable means includes a PN junction for converting and amplifier from an open collector configuration to a push-pull configuration upon being electrically altered.

23. The semiconductor memory according to claim 17 wherein said electrically alterable means includes a diode connected to said first transistor means for causing said output amplifier to have an open collector configuration and for converting said output amplifier to a push-pull configuration when the output of the buffer is grounded and the collector voltage is increased sufficiently to short said diode.

24. A method of electrically altering an amplifier configuration comprising the steps of:

connecting a first transistor means in an emitter follower configurations;

connecting a second transistor means in a common emitter configuration;

interconnecting said first and second transistor means in a push-pull configuration; and connecting an electrically alterable means to said first transistor means for causing said amplifier to be in a push-pull configuration and being electrically altered to permanently convert said amplifier to an open-collector configuration.

25. The method of claim 24 including the step of electrically altering by creating a voltage across or current through said electrically alterable means to permanently alter its electrical characteristics.

26. The method of claim 25 wherein said electrically alterable means includes a fusible element connected to said first transistor means to cause said amplifier to have a push-pull configuration and said electrical altering blows said fusible element to cause said amplifier to have an open-collector configuration.

27. The method of claim 25 wherein said electrically alterable means includes a diode connected to said first transistor means to cause said amplifier to have an open collector configuration and said electrically altering shorts said diode to cause said amplifier to have a push-pull configuration.

28. The method of claim 25 wherein said electrically altering step includes grounding the output of said amplifier and increasing bias voltage of said amplifier sufficient to permanently alter the electrical characteristics of said electrically alterable means.

29. In a push-pull amplifier having phase splitting means, a first transistor means in an emitter follower configuration, and a second transistor means in a common emitter configuration, the improvement comprising:

electrically alterable means in said first transistor means for permanently converting said amplifier from an open-collector to a push-pull configuration.

30. In a semiconductor memory having an output buffer which includes a preamplifier, a phase splitter and an output amplifier, the improvement being said output amplifier which comprises:

first transistor means in an emitter follower configuration;

second transistor means in a common emitter configuration; and electrically alterable means in said first transistor means for permanently converting said output amplifier from an open-collector to a push-pull configuration.

31. A method of electrically altering an amplifier configuration comprising the steps of:

connecting a first transistor means in an emitter follower configuration;

connecting a second transistor means in a common emitter configuration;

interconnecting said first and second transistor means in a push-pull configuration; and connecting an electrically alterable means to said first transistor means for causing said amplifier to be in an open-collector configuration and being electrically alterable to permanently convert said amplifier to a push-pull configuration.

32. The method of claim 31 including the step of electrically altering by creating a voltage across or current through said electrically alterable means to permanently alters its electrical characteristics.

* * * * *

UNITED STATES PATENT AND TRADEMARK OFFICE
CERTIFICATE OF CORRECTION

PATENT NO. : 4,153,883
DATED : May 8, 1979
INVENTOR(S) : David L. Taylor; Stephen A. Harris.

It is certified that error appears in the above-identified patent and that said Letters Patent are hereby corrected as shown below:

Column 3, line 49 after "true" insert -- open --.

Column 3, line 60 delete "circuit" insert -- collector --.

Column 3, line 63 delete "circuit" insert -- collector --.

Column 4, line 51 after "electrically" add -- altering the electrically --.

Claim 20, line 5 delete "a" insert -- an --.

Claim 22, line 2 delete "17" insert -- 30 --.

Claim 23, line 2 delete "17" insert -- 30 --.

Claim 27, line 1 delete "25" insert -- 32 --.

Claim 28, line 3 change "bias" to -- biasing --.

Signed and Sealed this

Twenty-seventh Day of November 1979

[SEAL]

Attest:

RUTH C. MASON
Attesting Officer

LUTRELLE F. PARKER
Acting Commissioner of Patents and Trademarks